(12) United States Patent
Bal et al.

(10) Patent No.: US 11,092,993 B2
(45) Date of Patent: Aug. 17, 2021

(54) DIGITAL SINUSOID GENERATOR

(71) Applicant: STMicroelectronics International N.V., Schiphol (NL)

(72) Inventors: Ankur Bal, Greater Noida (IN); Rupesh Singh, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 253 days.

(21) Appl. No.: 16/437,705

(22) Filed: Jun. 11, 2019

(65) Prior Publication Data

US 2019/0384347 A1    Dec. 19, 2019

Related U.S. Application Data

(60) Provisional application No. 62/686,312, filed on Jun. 18, 2018.

(51) Int. Cl.
*G06F 1/02* (2006.01)
*H03K 4/02* (2006.01)
*H03K 3/80* (2006.01)

(52) U.S. Cl.
CPC ............ *G06F 1/022* (2013.01); *H03K 3/80* (2013.01); *H03K 4/026* (2013.01)

(58) Field of Classification Search
CPC ........... G06F 1/022; H03K 3/80; H03K 4/026
USPC ....................................................... 708/276
See application file for complete search history.

(56) References Cited

U.S. PATENT DOCUMENTS

| | | | |
|---|---|---|---|
| 7,483,931 B2 * | 1/2009 | Shimotoyodome | H03H 17/0294 708/320 |
| 7,890,562 B2 | 2/2011 | Gross et al. | |
| 9,312,467 B2 * | 4/2016 | Kim | H01L 41/042 |
| 9,772,972 B2 | 9/2017 | Pagnanelli | |
| 2020/0389180 A1* | 12/2020 | Bal | H03M 3/466 |
| 2021/0110852 A1* | 4/2021 | Bal | H03L 7/1075 |

OTHER PUBLICATIONS

Peceli, "Finite Wordlength Effects in Digital Filters," https://pp.bme.hu/ee/article/download/4693/3798, 1984 (10 pages).

* cited by examiner

*Primary Examiner* — Tomi Skibinski
(74) *Attorney, Agent, or Firm* — Crowe & Dunlevy

(57) ABSTRACT

A recursive digital sinusoid generator generates recursive values used in the production of a digital sinusoid output. The recursive values are generated at a first frequency. A sinusoid value generator generates replacement values at a second frequency, wherein the second frequency is less than the first frequency. The generated recursive values are periodically replaced with the generated replacement values without interrupting production of the digital sinusoid output at the first frequency. This periodic replacement effectively corrects for a finite precision error which accumulates in the recursive values over time.

21 Claims, 1 Drawing Sheet

DIGITAL SINUSOID GENERATOR

CROSS-REFERENCE TO RELATED APPLICATION

This application claims the priority benefit of U.S. Provisional Application for Patent No. 62/686,312 filed Jun. 18, 2018, the disclosure of which is incorporated by reference.

TECHNICAL FIELD

The present invention relates generally to the generation of a sinusoid signal and, more particularly, to a digital sinusoid generator.

BACKGROUND

It is known in the art to store the values of a sinusoid in a memory (for example, a random access memory—RAM) and then generate the sinusoid output by looping through the stored values. See, for example, U.S. Pat. Nos. 7,890,562 and 9,312,467 (incorporated by reference). These solutions are not ideal. The on-chip RAM limits the frequency resolution of the sinusoid as well as the throughput operational speed. These implementations are also area inefficient. Indeed, the size of the memory becomes a significant concern when a high frequency resolution for the generated sinusoid is required.

Another known solution utilizes a recursive method for digital sinusoid generation. Reference is now made to FIG. 1 which shows a schematic view of a conventional digital sinusoid generator 10 which utilizes a second order infinite impulse response (IIR) type digital filter 12. The filter 12 includes an input configured to receive an input digital signal X(n) and an output configured to output a digital output signal Y(n). The filter 12 operates in response to a clock signal and the index n for the sampling and calculation operations is incremented by an integer value of one with each cycle of the clock signal (where each clock cycle corresponds to one sampling period of time).

The filter 12 is formed by a digital adder 20 that adds a first feedback digital signal Y1, a second feedback digital signal Y2 and the input digital signal X(n) to generate the digital output signal Y(n). The first feedback digital signal Y1 is equal to a one sample delay of the digital output signal Y(n), i.e., Y(n−1), produced by a delay ($Z^{-1}$) 22 and multiplied by a constant A1 provided by multiplier 26. Thus, the first feedback digital signal Y1 equals A1*Y(n−1). The second feedback digital signal Y2 is equal to a two sample delay of the digital output signal Y(n), i.e., Y(n−2), produced by the delay ($Z^{-1}$) 22 and a delay ($Z^{-1}$) 24 and multiplied by a constant A2 provided by multiplier 28. Thus, the second feedback digital signal Y2 equals A2*Y(n−2). It will be understood by those skilled in the art that this is just a generic representation of the recursive IIR operation. The fixed coefficients of the IIR are dependent on the recursive equation that is used (with A1 and A2 being just an example for a possible implementation).

With a proper selection of the multiplier constants A1 and A2, as well as at least the initial values of the input digital signal X(n) at n=0 and the digital output signal Y(n) at n=−1 and n=−2 (referred to in the art as the initial conditions of the filter), in view of the frequency of the clock signal, the filter can be configured to generate the digital output signal Y(n) having data values which define a digital sinusoid having a desired frequency. A further circuit 14, such as a digital to analog converter, converts the digital output signal Y(n) to an analog sinusoid output signal 16.

As an example of this, consider a case where 40 cycles of the clock signal correspond to one period of the desired sinusoid output. The Y values for that one period of the sinusoid, for sample n (for n=0 to 39), are thus defined by:

$$Y(n) = \sin\left(\frac{2\pi}{40}n\right) \qquad \text{Equation (1)}$$

Many ways exist for determining the values of the multiplier constants A1 and A2 required to generate the desired sinusoid output. As just one example of a readily understandable technique for determining A1 and A2, the following difference equation can solved:

$$Y(n)=A1*Y(n-1)+A2*Y(n-2) \qquad \text{Equation (2)}$$

To solve Equation (2) for the multiplier constants A1 and A2, consider the following two instances of the difference equation for two different values of n, such as n=2 and n=3:

$$Y(2)=A1*Y(1)+A2*Y(0), \text{ and} \qquad \text{Equation (3)}$$

$$Y(3)=A1*Y(2)+A2*Y(1). \qquad \text{Equation (4)}$$

For the desired sinusoid, the Y(n) values at n=0, n=1, n=2 and n=3 can be calculated from the Equation (1). Those values are as follows:

$$Y(0) = \sin\left(\frac{2\pi}{40}0\right) = 0$$

$$Y(1) = \sin\left(\frac{2\pi}{40}1\right) \cong 0.1564$$

$$Y(2) = \sin\left(\frac{2\pi}{40}2\right) \cong 0.3090$$

$$Y(3) = \sin\left(\frac{2\pi}{40}3\right) \cong 0.4540$$

Substituting the calculated Y values into Equation (3) and Equation (4) gives:

$$0.3090=A1*0.1564+A2*0, \text{ and} \qquad \text{Equation (5)}$$

$$0.4540=A1*0.3090+A2*0.1564. \qquad \text{Equation (6)}$$

With two Equations (5) and (6) and two variables A1 and A2, it is easy to solve for the variables and the result is: A1=1.9754 and A2=−1. If the filter 12 is supplied with the constants A1 and A2 as calculated, and is further supplied with the initial condition values of X(0)=0, Y(−1)=−0.1564 and Y(−2)=−0.3090, the filter will respond to the clock signal and the corresponding incrementing index n from n=0 to n=39 by producing Y values which define a sinusoidal digital output.

As another example, the value of A1 can instead be computed from the equation $2*\sin(\omega_0/2)$ as is discussed in more detail herein. This calculation is well suited for being performed by a processor.

A control circuit 30 is provided to supply the multiplier constants A1 and A2 and the initial condition values. The multiplier constants A1 and A2 and the initial condition values are programmable and thus the filter 12 can be configured to generate a sinusoid having a desired frequency.

A concern with the use of a recursive function, such as is implemented with the IIR filter 12, is the accumulation of quantization errors due to finite word length width with respect to the recursively generated data. Consider in this regard the example of the multiplication of Y(n−1) by A1 to produce Y1. If Y(n−1) and A1 are both five bit numbers, their product doubles the number of bits to ten. If the filter 12, however, is provided with registers for storing the data of less than ten bits, for example five bits, then the ten bit product must somehow be converted to five bits. Many techniques for such a conversion are known to those skilled in the art (rounding, flooring, ceiling, etc.). This conversion process is referred to as quantization, and the difference between the two values is the quantization error. With each iteration of the filter processing operation, there is an accumulation of the quantization error and the output of the filter 12 becomes increasingly degraded.

There is a need in the art to address this concern and make the output sinusoid generated by recursive function more accurate over time.

SUMMARY

In an embodiment, an apparatus comprises: a recursive digital sinusoid generator configured to generate one or more recursive values for producing a digital sinusoid output, the recursive values being generated at a first frequency; and a sinusoid value generator configured to generate one or more replacement values at a second frequency, wherein the second frequency is less than the first frequency; and a control circuit configured to cause a periodic replacement of at least one of the generated recursive values with at least one of the generated replacement values without interrupting production of the digital sinusoid output at the first frequency.

In an embodiment, a method comprises: generating at a first frequency one or more recursive values for producing a digital sinusoid output; generating one or more replacement values at a second frequency, wherein the second frequency is less than the first frequency; and periodically replacing at least one of the generated recursive values with at least one of the generated replacement values without interrupting production of the digital sinusoid output at the first frequency.

BRIEF DESCRIPTION OF THE DRAWINGS

For a better understanding of the embodiments, reference will now be made by way of example only to the accompanying figures in which.

DETAILED DESCRIPTION

Figure 1:
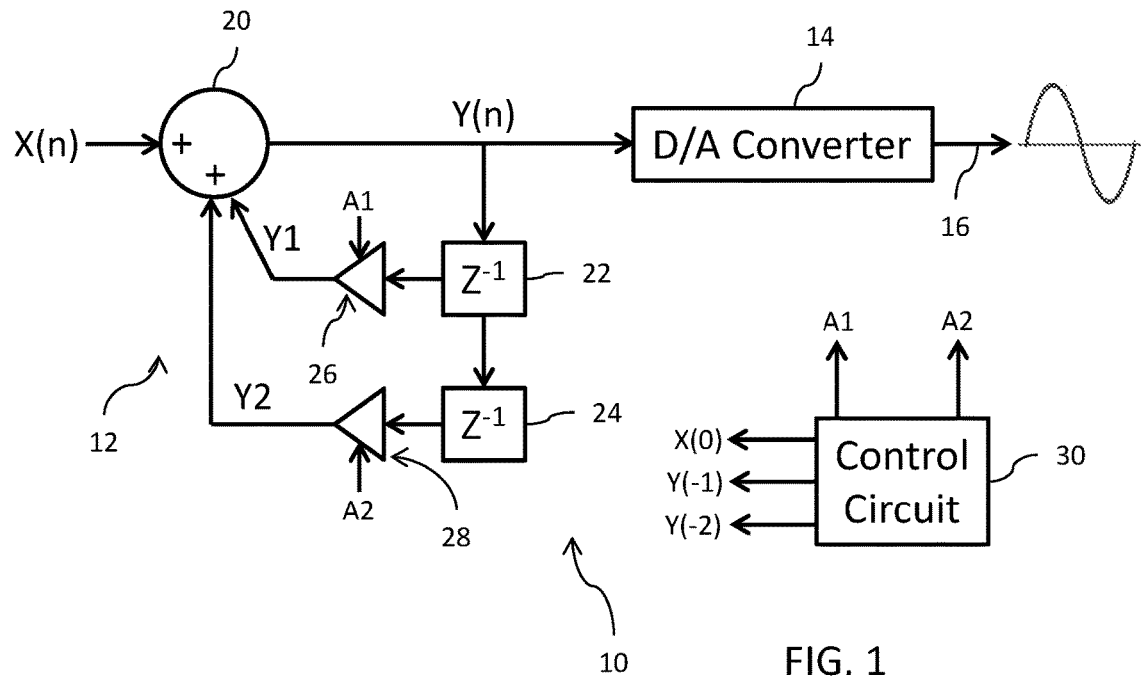
FIG. 1 shows a schematic view of a conventional digital sinusoid generator which utilizes a second order infinite impulse response (IIR) type digital filter.
Figure 2:
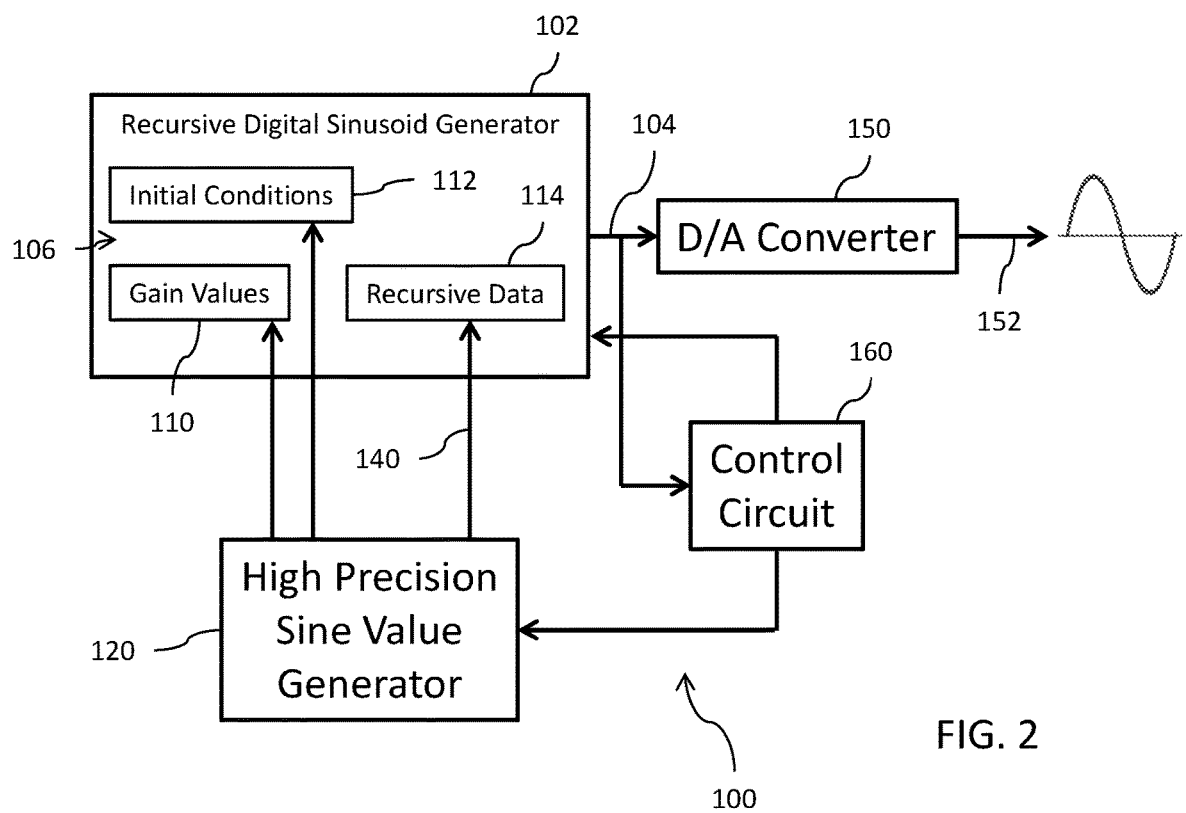
FIG. 2 shows a schematic view of an embodiment of a digital sinusoid generator.

Reference is now made to FIG. 2 which shows a schematic view of an embodiment of a digital sinusoid generator 100. The generator 100 includes a recursive digital sinusoid generator 102. As an example, the recursive digital sinusoid generator 102 may be implemented using a second order infinite impulse response (IIR) type digital filter (like the filter 12 shown in FIG. 1). It will be understood, however, that other recursive identities configurable for generating a digital sinusoid could instead be used. The generation of a digital sinusoid output 104 by the recursive digital sinusoid generator 102 is, generally speaking, governed by a set of operating parameters 106. In the case of the IIR type digital filter of the type shown in FIG. 1, for example, the set of operating parameters 106 would include the gain values 110 (i.e., the multiplier constants A1 and A2) and the initial condition values 112 (i.e., values for X(0), Y(−1) and Y(−2)).

The digital sinusoid generator 100 operates responsive to a clock signal having a frequency fclk (referred to as the sampling frequency) to generate values of the digital sinusoid output 104 at a frequency which may generally be within the Nyquist range (i.e., fclk/2), for example. The recursive digital sinusoid generator 102 generates recursive data 114 and produces a new value for the digital sinusoid output 104 with each cycle of the clock signal. As noted above, a finite precision error is introduced with the recursive calculation of each successive new value that is generated by the recursive digital sinusoid generator 102. This error is due, for example, to the finite word length width for the digital circuitry (such as data registers, multipliers, adders, and the like) of the recursive digital sinusoid generator 102 which are used to store and process the recursive data and gain values. Over time, for example, over a few hundred or a few thousand cycles (depending on the characteristics of the desired sinusoid), the precision of the values for the digital sinusoid output 104 produced by the recursive digital sinusoid generator 102 deteriorates to the point where the quality of the generated sinusoid is no longer acceptable.

To address the foregoing concern, the digital sinusoid generator 100 further includes a high precision sine value generator 120 which operates to generate a set of replacement values 140 having a high degree of precision. In the case of the recursive digital sinusoid generator 102, for example, the set of replacement values could include high precision values for the recursive data 114. On a periodic basis, the generated set of replacement values 140 is loaded into the recursive digital sinusoid generator 102 and further recursive calculations made by the recursive digital sinusoid generator 102 will be derived from the newly loaded replacement values 140 (instead of the previously calculated recursive values which included the accumulated error). The rate at which the replacement values 140 are loaded into the recursive digital sinusoid generator 102 is a fraction of the frequency of the clock signal. For example, the rate may be fclk/M, where M is much greater than 1 and typically is an integer value in the range of a few hundred to a few thousand. Thus, once every M clock cycles the recursive digital sinusoid generator 102 is loaded with the set of replacement values 140 that were periodically generated by the high precision sine value generator 120.

Considering in more detail the example of the IIR type digital filter of FIG. 1 for the recursive digital sinusoid generator 102, the recursive data 114 would comprise the Y(n), Y(n−1) and Y(n−2) data used by the filter 12. Alternatively, the recursive data 114 would comprise the Y(n), Y1 and Y2 data used by the filter 12. Once every M clock cycles the recursive data 114 (which includes an accumulated error offset) is replaced by the replacement values 140 generated by the high precision sine value generator 120. The replacement may be accomplished, for example, by flushing and reloading the digital registers of the recursive digital sinusoid generator 102 which store the recursive data 114 (for example, the registers which store the Y(n), Y(n−1) and Y(n−2) data). This operation will effectively eliminate the finite precision error which creeps into the recursive calculations over time by periodically updating the recursive data with high precision replacement values. The once every M clock cycles timing is configurable and thus the particular sine angle where the flush and replace operation occurs is known in advance. The high precision sine value generator 120 operates to pre-calculate the correct (with high precision) values for the recursive data 114 as the replacement values 140 for that particular sine angle for loading at the proper time so that there is no interruption in the generation of the digital sinusoid output 104.

As a further example, consider a recursive digital sinusoid generator 102 where the recursive data 114 for the sinusoid generation is defined by the following:

$$x1(n)=x1(n-1)+\psi*x2(n-1), \text{ and}$$

$$x2(n)=x2(n-1)-\psi*x1(n),$$

where:

$\psi=2*\sin(\omega_0/2)$, $x1(n)=\sin(\omega_0(n-(\frac{1}{2})))$, and $x2(n)=\cos(\omega_0 n)$ for the desired sinusoid.

The value for $\psi$ is initially computed and fixed by the high precision sine value generator 120. The initial conditions are set for n=1 by the high precision sine value generator 120 as follows: $x1(1)=\sin(\omega_0/2)$ and $x2(1)=\cos(\omega_0)$.

For example, after 100 clock cycles, the values for x1(100) and x2(100) of the recursive data 114 will have accumulated a finite precision error due to quantization. To address this quantization error, high precision sine value generator 120 refreshes the recursive data 114 by calculating precisely the x1(100) and x2(100) values for the clock cycle n=100 as the replacement values 140. These calculated replacement values 140 are then introduced at the clock cycle for n=101 to replace the recursively generated values (which include the quantization error) while the clock continues to run the sinusoid values are being generated. There is no interruption of the sinusoid generation process.

The high precision sine value generator 120 may be implemented using a coordinate rotation digital computer (CORDIC). Those skilled in the art understand that CORDIC implements a hardware efficient iterative method which uses rotations to calculate a wide range of elementary functions. In this case, the elementary function calculated by CORDIC is the sinusoid function. The CORDIC may operate at the same frequency fclk as the recursive digital sinusoid generator 102. However, the throughput of the CORDIC is orders of cycles less than the recursive digital sinusoid generator 102 since many cycles of the clock signal are needed to make each calculation of the replacement values. The CORDIC can be highly hardware optimized because it is operating at a lower speed than the recursive digital sinusoid generator 102. This relaxed implementation allows CORDIC to perform its operations sequentially, and this advantageously enables hardware reuse across iterations with an accompanying savings in occupied circuit area and power consumption.

The CORDIC operation of interest is as a high precision sine angle calculator from which the replacement values associated with the particular sine angle of interest are generated. The particular sine angles of interest where the periodic correction operation is to be performed are known to CORDIC in advance. For example, those angles of interest are selected so as to arise prior to unacceptable deterioration in the precision of the values for the digital sinusoid output 104. During the M clock cycles preceding occurrence of the next sine angle of interest, the CORDIC operates to generate the impending replacement values associated with that next sine angle of interest. When the sample value of n is reached that corresponds to that next sine angle of interest, the CORDIC of the high precision sine value generator 120 makes the replacement values available for loading into the recursive digital sinusoid generator 102.

The digital sinusoid generator 100 includes a control circuit 160 which coordinates the operation of the recursive digital sinusoid generator 102 and the high precision sine value generator 120. Initially, the control circuit 160 can specify the characteristics of the desired sinusoid output to be generated and instruct the high precision sine value generator 120 to generate the required gain values 110 (for example, the multiplier constants A1 and A2) and the initial condition values 112 (for example, values for X(0), Y(−1) and Y(−2)) necessary for the recursive digital sinusoid generator 102 to generate the desired sinusoid output (or, generate the $\psi$, x1(1) and x2(1) values for the initial condition values 112). An appropriate control signal is applied to the recursive digital sinusoid generator 102 to cause loading of the gain values 110 and initial condition values 112. During operation of the recursive digital sinusoid generator 102, the control circuit 160 tracks the digital sinusoid output 104 and based on the value of M instructs the high precision sine value generator 120 with an identification of the next sine angle of interest for pre-calculation of the replacement values. At the proper time when the sample value of n for the generated digital sinusoid output 104 is reached that corresponds to that sine angle of interest, the control circuit 160 instructs the recursive digital sinusoid generator 102 to cause loading of the replacement values 140 which were pre-calculated by the high precision sine value generator 120. A more precise next value for the digital sinusoid output 104 is then generated by the recursive digital sinusoid generator 102. Production of values of the digital sinusoid output 104 at the frequency fclk is not interrupted by the process to load the replacement values.

A further circuit 150, such as a digital to analog converter, converts the digital output signal 104 to an analog sinusoid output signal 152.

The system of FIG. 2 can be implemented in any suitable hardware, software, firmware, or a combination thereof, without departing from the scope of the invention.

The system may include a processor and a memory, the memory having the computer executable instructions for executing a process for implementing the recursive sine generation and CORDIC processing operations. The computer executable instructions, in whole or in part, may also be stored on a computer readable medium separated from the system on which the instructions are executed. The computer readable medium may include any volatile or non-volatile storage medium such as flash memory, compact disc memory, and the like.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:
1. An apparatus, comprising:
 a recursive digital sinusoid generator configured to generate one or more recursive values for producing a digital sinusoid output, the recursive values being generated at a first frequency;

a sinusoid value generator configured to generate one or more replacement values at a second frequency, wherein the second frequency is less than the first frequency; and a control circuit configured to cause a periodic replacement of at least one of the generated recursive values with at least one of the generated replacement values without interrupting production of the digital sinusoid output at the first frequency.

2. The apparatus of claim 1, wherein the recursive digital sinusoid generator initially produces the digital sinusoid output in response to a set of operating parameters, and wherein the sinusoid value generator is further configured to generate said set of operating parameters.

3. The apparatus of claim 2, wherein the set of operating parameters includes one or more gain values.

4. The apparatus of claim 2, wherein the set of operating parameters includes one or more initial condition values for said one or more recursive values.

5. The apparatus of claim 1, wherein said one or more recursive values accumulate a finite precision error over time and the periodic replacement of at least one of the generated recursive values with at least one of the generated replacement values corrects for the accumulated finite precision error.

6. The apparatus of claim 1, wherein the periodic replacement occurs once every few hundred times the one or more recursive values are generated.

7. The apparatus of claim 1, wherein the periodic replacement occurs once every few thousand times the one or more recursive values are generated.

8. The apparatus of claim 1, wherein the recursive digital sinusoid generator is a n-th order infinite impulse response (IIR) type digital filter configured by a set of operating parameters to generate the digital sinusoid output.

9. The apparatus of claim 8, wherein the n-th order is a second order.

10. The apparatus of claim 8, wherein the set of operating parameters includes a delay feedback gain value.

11. The apparatus of claim 8, wherein the set of operating parameters includes initial condition values for the one or more recursive values.

12. The apparatus of claim 1, wherein the sinusoid value generator comprises a coordinate rotation digital computer (CORDIC) configured to generate the replacement values for certain angles of a desired sinusoid.

13. The apparatus of claim 12, wherein the certain angles are periodic angles.

14. The apparatus of claim 12, wherein the control circuit causes at least one of the generated replacement values to replace at least one of the generated recursive values when an angle of the digital sinusoid output matches the certain angle at which the CORDIC generated the replacement values.

15. A method, comprising:

generating at a first frequency one or more recursive values for producing a digital sinusoid output;

generating at a second frequency one or more replacement values, wherein the second frequency is less than the first frequency; and periodically replacing at least one of the generated recursive values with at least one of the generated replacement values without interrupting production of the digital sinusoid output at the first frequency.

16. The method of claim 15, wherein said one or more recursive values accumulate a finite precision error over time and the periodic replacement of at least one of the generated recursive values with at least one of the generated replacement values corrects for the accumulated finite precision error.

17. The method of claim 15, wherein the periodic replacement occurs once every few hundred times the one or more recursive values are generated.

18. The method of claim 15, wherein the periodic replacement occurs once every few thousand times the one or more recursive values are generated.

19. The method of claim 15, wherein the replacement values are generated for certain angles of a desired sinusoid.

20. The method of claim 19, wherein the certain angles are periodic angles.

21. The method of claim 19, wherein the at least one of the generated replacement values replaces at least one of the generated recursive values when an angle of the digital sinusoid output matches the certain angle for which the replacement values were generated.

* * * * *